(12) United States Patent
Justin et al.

(10) Patent No.: US 11,509,988 B1
(45) Date of Patent: Nov. 22, 2022

(54) HEADSET HEADBAND PROFILE SENSOR WITH SMART FEATURES CONTROL

(71) Applicant: Dell Products L.P., Round Rock, TX (US)

(72) Inventors: Wong Hin Loong Justin, Singapore (SG); Manish Krishnaji Desai, Singapore (SG); Siluvai Micheal Starlin Innasimuthu, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/462,098

(22) Filed: Aug. 31, 2021

(51) Int. Cl.
*H04R 1/10* (2006.01)
*G01B 7/16* (2006.01)
*G01R 19/165* (2006.01)

(52) U.S. Cl.
CPC .............. *H04R 1/1041* (2013.01); *G01B 7/18* (2013.01); *G01R 19/16576* (2013.01); *H04R 1/105* (2013.01); *H04R 1/1008* (2013.01); *H04R 2420/07* (2013.01)

(58) Field of Classification Search
CPC .... H04R 1/1041; H04R 1/1008; H04R 1/105; G01B 7/18; G01R 19/16576
See application file for complete search history.

(56) References Cited

U.S. PATENT DOCUMENTS

| | | | |
|---|---|---|---|
| 2017/0280223 A1* | 9/2017 | Cavarra | G06F 3/167 |
| 2022/0264467 A1* | 8/2022 | Zhao | H04W 52/0235 |

* cited by examiner

*Primary Examiner* — Simon King
(74) *Attorney, Agent, or Firm* — Terrile, Cannatti & Chambers; Stephen A. Terrile

(57) ABSTRACT

A headset which includes an earpiece; a flexible headband coupled to the earpiece, the flexible headband including a flex sensing component, the headband profile sensing component determining when the headset is in a headset un-used orientation and a headset used orientation; and, a smart power control system, the smart power control system performing a smart power control operation based upon whether the headset is in the headset un-used orientation or the headset used orientation.

10 Claims, 18 Drawing Sheets

| HEADBAND STATE | FLEX SENSOR STATE | RESISTANCE $R_1$ (ohms) | RESISTANCE $R_2$ (ohms) | VOLTAGE $V_{IN}$ | VOLTAGE $V_{OUT}$ | WAKE UP GPIO STATE | POWER OF HEADSET CONTROL |
|---|---|---|---|---|---|---|---|
| UNFLEXED | FLEXED | 40K | 40K | 3.3V | 1.65V | LOW ($V_{OUT}$ < 1.8V) | SIMULATING USER REMOVED THE HEADSET FROM USER'S HEAD. SIGNAL TO MCU TO DEEP SLEEP MODE<br>• ACTIVATING SMART POWER OFF OR FEEDBACK HEADSET NOT WORN |
| FLEXED | UNFLEXED | 20K | 40K | 3.3V | 2.2V | HIGH ($V_{OUT}$ > 1.8V) | SIMULATING USER WEARING HEADSET ON USER'S HEAD. HEADSET IN ACTIVE MODE<br>• ACTIVATING SMART POWER ON OR FEEDBACK HEADSET WORN |
| ULTRA-FLEXED | MORE UNFLEXED THAN ABOVE STATE | 15K | 40K | 3.3V | 2.4V | HIGHER ($V_{OUT}$ > 2.3V) | SIMULATING USER PRYING AWAY EARPIECE WHEN HEADSET IS ALREADY ON USER'S HEAD. HEADSET IN ACTIVE MODE |
| NA | FLAT (NOT ASSEMBLED ON HEADSET) | 10K | NA | NA | NA | NA | FLAT POSITION (i.e. NOMINAL RESISTANCE) OF THE FLEX SENSOR OUT OF THE FACTORY WILL HAVE RESISTANCE TOLERANCE ON SOME DEGREE OF THE FLEX THAT WILL DIFFER BETWEEN EACH SENSOR (ASSUMPTION OF THE DESIGN WE NEED TO HAVE 30% TOLERANCE) |

FIG. 11A

| HEADBAND STATE | FORCE RESISTIVE SENSOR STATE | RESISTANCE $R_1$ (ohms) | RESISTANCE $R_2$ (ohms) | VOLTAGE $V_{IN}$ | VOLTAGE $V_{OUT}$ | WAKE UP GPIO STATE | POWER OF HEADSET CONTROL |
|---|---|---|---|---|---|---|---|
| UNFLEXED | LOW FORCE ON SENSOR BY DEFLECTOR | 40K | 40K | 3.3V | 1.65V | LOW ($V_{OUT} < 1.8V$) | SIMULATING USER REMOVED THE HEADSET FROM USER'S HEAD. SIGNAL TO MCU TO DEEP SLEEP MODE<br>• ACTIVATING SMART POWER OFF OR FEEDBACK HEADSET NOT WORN |
| FLEXED | HIGH FORCE ON SENSOR BY DEFLECTOR | 20K | 40K | 3.3V | 2.2V | HIGH ($V_{OUT} > 1.8V$) | SIMULATING USER WEARING HEADSET ON USER'S HEAD. HEADSET IN ACTIVE MODE<br>• ACTIVATING SMART POWER ON OR FEEDBACK HEADSET WORN |
| ULTRA-FLEXED | HIGHER FORCE ON SENSOR THAN ABOVE STATE | 15K | 40K | 3.3V | 2.4V | HIGHER ($V_{OUT} > 2.3V$) | SIMULATING USER PRYING AWAY EARPIECE WHEN HEADSET IS ALREADY ON USER'S HEAD. HEADSET IN ACTIVE MODE |
| NA | NO FORCE BY DEFLECTOR - FLAT (NOT ASSEMBLED ON HEADSET) | 50K | NA | NA | NA | NA | FLAT POSITION (i.e., NOMINAL RESISTANCE) OF THE FLEX SENSOR OUT OF THE FACTORY WILL HAVE RESISTANCE TOLERANCE ON SOME DEGREE OF THE FLEX THAT WILL DIFFER BETWEEN EACH SENSOR (ASSUMPTION OF THE DESIGN WE NEED TO HAVE 30% TOLERANCE) |

FIG. 11B

| | BATTERY CAPACITY (mAh) | CURRENT (mA) CONSUMPTION | PER DAY USAGE SCENARIO SIMULATION | | |
|---|---|---|---|---|---|
| | | | ACTIVE HOURS | SLEEP HOURS | BATTERY LIFE IN DAYS |
| HEADSET WITHOUT FLEX CIRCUIT - ACTIVE STATE | 750 | 27 | 2 | 22 | 11.16 |
| HEADSET WITHOUT FLEX CIRCUIT - STANDBY STATE | 750 | 0.6 | | | |
| HEADSET WITH FLEX CIRCUIT CONSUMPTION AND BT IC AND DC/DC IN DEEP SLEEP | 750 | 0.1 | | | |
| HEADSET WITH FLEX CIRCUIT - ACTIVE STATE | 750 | 27.1 | | | 13.30 |
| HEADSET WITH FLEX CIRCUIT CONSUMPTION AND BT IC AND DC/DC IN DEEP SLEEP | 750 | 0.1 | | | |
| | | | | IMPROVEMENT IN DAYS => | 2.14 |
| | | | | | 19% |

FIG. 12A

| | BATTERY CAPACITY (mAh) | CURRENT (mA) CONSUMPTION | ACTIVE HOURS | SLEEP HOURS | BATTERY LIFE IN DAYS |
|---|---|---|---|---|---|
| HEADSET WITHOUT FLEX CIRCUIT - ACTIVE STATE | 750 | 27 | 4 | 20 | 6.25 |
| HEADSET WITHOUT FLEX CIRCUIT - STANDBY STATE | 750 | 0.6 | | | |
| HEADSET WITH FLEX CIRCUIT CONSUMPTION AND BT IC AND DC/DC IN DEEP SLEEP | 750 | 0.1 | | | |
| HEADSET WITH FLEX CIRCUIT - ACTIVE STATE | 750 | 27.1 | | | 6.79 |
| HEADSET WITH FLEX CIRCUIT CONSUMPTION AND BT IC AND DC/DC IN DEEP SLEEP | 750 | 0.1 | | | |
| | | | | IMPROVEMENT IN DAYS => | 0.54 |
| | | | | | 9% |

FIG. 12B

| | BATTERY CAPACITY (mAh) | CURRENT (mA) CONSUMPTION | PER DAY USAGE SCENARIO SIMULATION | | |
|---|---|---|---|---|---|
| | | | ACTIVE HOURS | SLEEP HOURS | BATTERY LIFE IN DAYS |
| HEADSET WITHOUT FLEX CIRCUIT - ACTIVE STATE | 750 | 27 | 8 | 16 | 3.32 |
| HEADSET WITHOUT FLEX CIRCUIT - STANDBY STATE | 750 | 0.6 | | | |
| HEADSET WITH FLEX CIRCUIT CONSUMPTION AND BT IC AND DC/DC IN DEEP SLEEP | 750 | 0.1 | | | |
| HEADSET WITH FLEX CIRCUIT - ACTIVE STATE | 750 | 27.1 | | | 3.43 |
| HEADSET WITH FLEX CIRCUIT CONSUMPTION AND BT IC AND DC/DC IN DEEP SLEEP | 750 | 0.1 | | | |
| | | | | IMPROVEMENT IN DAYS => | 0.11 |
| | | | | | 3% |

FIG. 12C

HEADSET HEADBAND PROFILE SENSOR WITH SMART FEATURES CONTROL

BACKGROUND OF THE INVENTION

Field of the Invention

The present invention relates to information handling systems. More specifically, embodiments of the invention relate to smart features control of headsets.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to a headset which includes an earpiece; a flexible headband coupled to the earpiece, the flexible headband including a headband profile sensing component, the headband profile sensing component determining when the headset is in a headset un-used orientation and a headset used orientation; and, a smart features control system, the smart features control system performing a smart features control operation based upon whether the headset is in the headset un-used orientation or the headset used orientation.

In another embodiment the invention relates to a system comprising: a processor; a data bus coupled to the processor; and an input/output device, the input/output device including a headset, the headset comprising an earpiece; a flexible headband coupled to the earpiece, the flexible headband including a headband profile sensing component, the headband profile sensing component determining when the headset is in a headset un-used orientation and a headset used orientation; and, a smart features control system, the smart features control system performing a smart features control operation based upon whether the headset is in the headset un-used orientation or the headset used orientation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 11A and 11B show example values for various states of a headset incorporating smart power control.

FIGS. 12A, 12B and 12C show example battery life-saving estimates for a wireless headset which incorporates a smart power control system.

DETAILED DESCRIPTION

Figure 1:
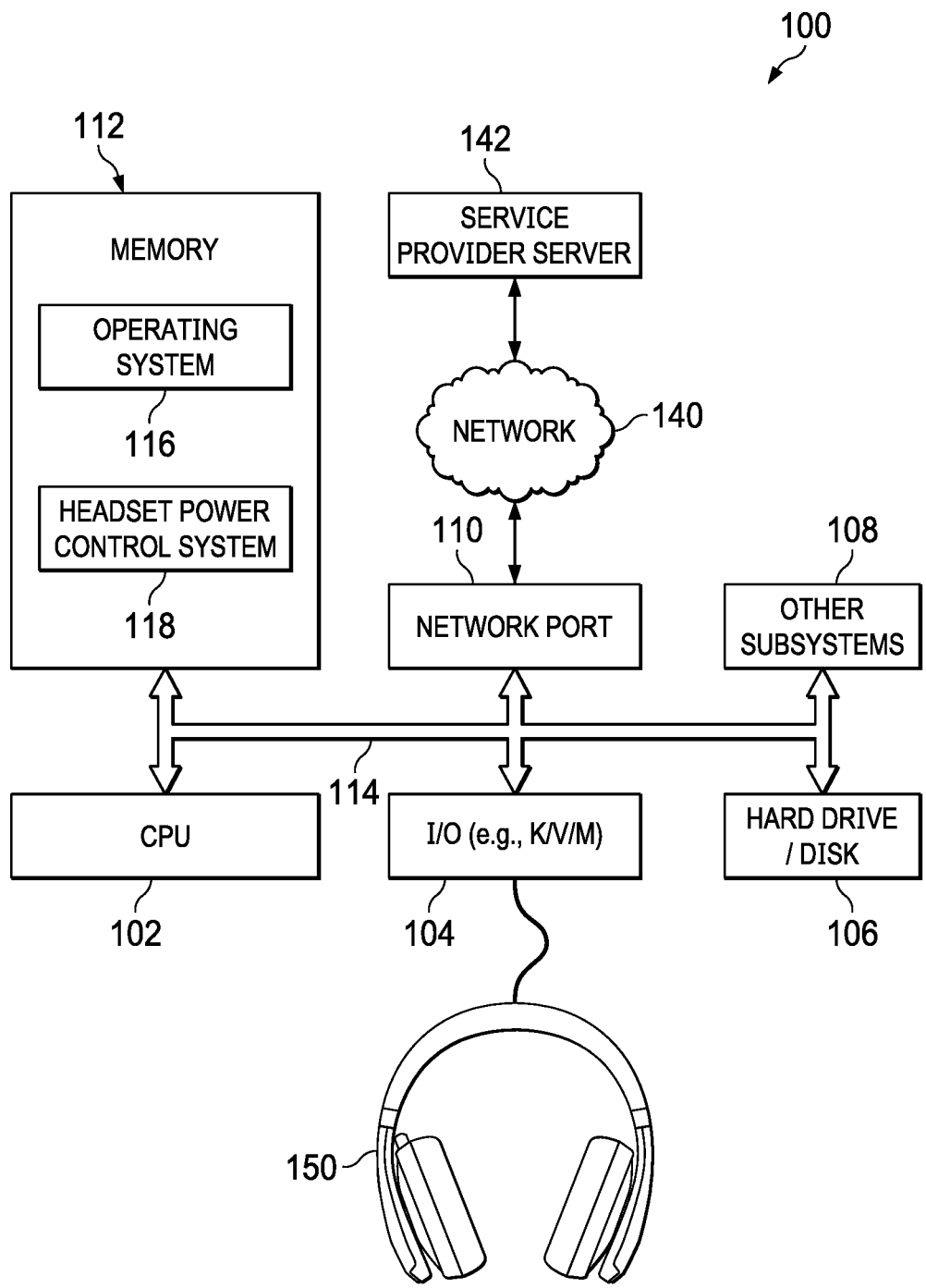
FIG. 1 shows a general illustration of components of an information handling system as implemented in the system and method of the present invention.

Certain aspects of the present disclosure reflect an appreciation that extending the battery life for wireless products such as wireless headsets is desirable. Certain aspects of the present disclosure include an appreciation that known wireless headsets are often equipped with a power button (which is either physical or capacitive) to allow user to power the headset on and off when desired. Certain aspects of the present disclosure include an appreciation that physical power buttons can pose an issue for user to probe blindly for its actuation when headset is being worn on one's head. For example, blindly searching for the power button can cause accidental actuation of neighboring buttons (e.g., Volume Up/Down, BT pairing Buttons). Alternately, actuation of the power button can occur while searching for other physical buttons.

Certain aspects of the present disclosure include an appreciation that certain known wireless headsets incorporate firmware algorithms to reduce battery drainage if a user does not immediately power off the headset after usage. With certain known wireless headsets, the firmware algorithms can be implemented to cause the headset to enter a sleep mode or a deep sleep mode of operation. Certain aspects of the present disclosure include an appreciation that the duration before enabling a sleep or deep sleep mode, and the periods during these sleep/deep sleep modes can impact the battery drainage and have adverse effect on user experience. For example, setting too short a duration impacts headset wake-up response, setting too long a duration drains battery life and current is often still required to check on audio input activity if the headset is not Powered off during the various Sleep/Deep Sleep Modes.

A system, method, and computer-readable medium are disclosed for providing a wireless headset with smart power control functionality. More specifically, the wireless headset is provided with a power control mechanism along with a headset smart power control system. In certain embodiments, the power control mechanism includes a flex sensor which is electrically coupled to power control circuitry of the headset. In certain embodiments, an electrical characteristic (e.g., the resistance) of the flex sensor changes when the flex sensor is flexed in one direction but not the other. For example, the electrical characteristic increases when the flex sensor is flexed in a downward direction (i.e., a frown profile) but does not change when the flex sensor is flexed in an upward direction (i.e., a smile profile).

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise a headset smart power control system. In one embodiment, the information handling system 100 is able to download the headset smart power control system 118 from the service provider server 142. In another embodiment, the headset smart power control system 118 is provided as a service from the service provider server 142. In various embodiments, the I/O devices 104 include a headset 150. In certain embodiments, the headset 150 is a wireless headset and the I/O devices include an associated communication controller (e.g., a Bluetooth controller).

Figure 2A:
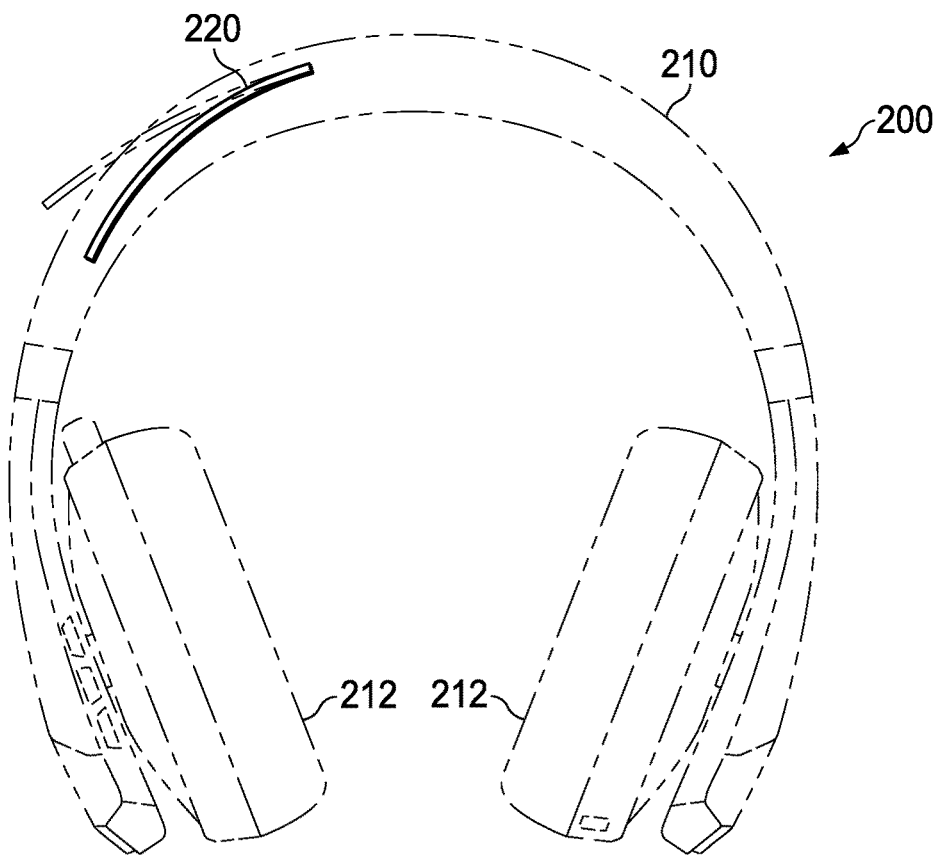
FIGS. 2A, 2B and 2C show front views of a headset incorporating smart features control.
Figure 3A:
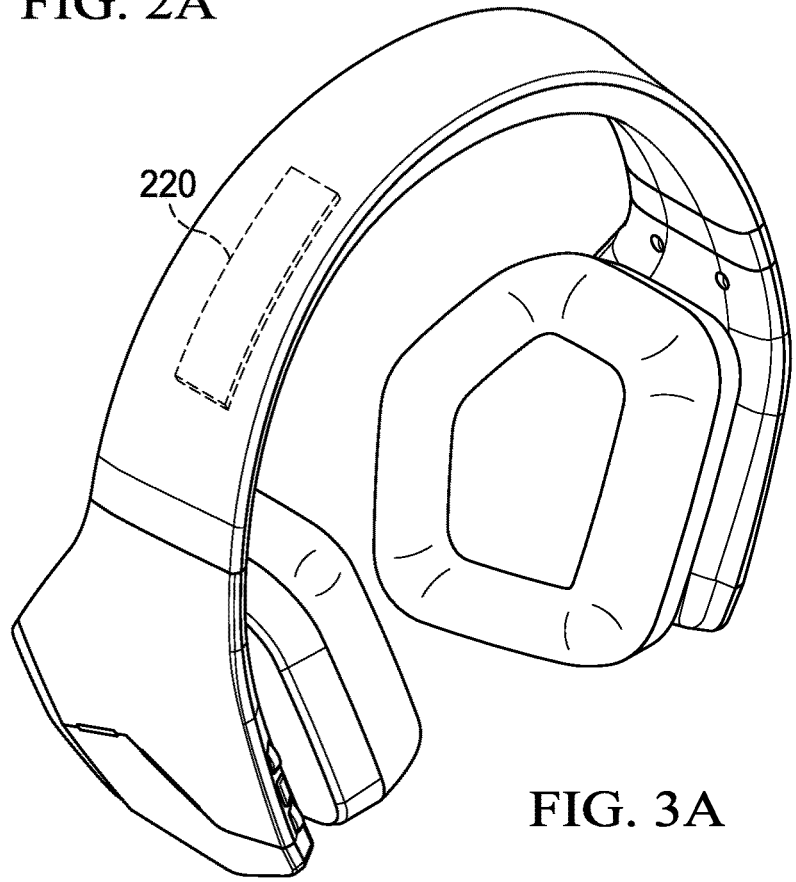
FIGS. 3A, 3B and 3C show perspective views of a headset incorporating smart features control.
Figure 2B:
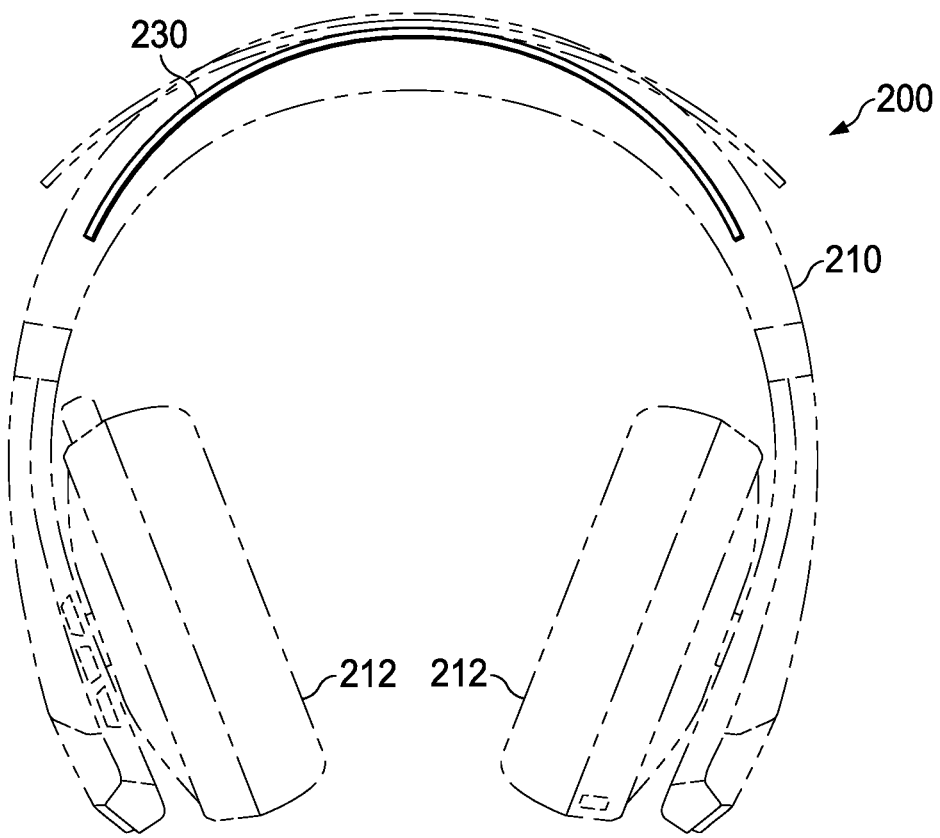
Figure 3B:
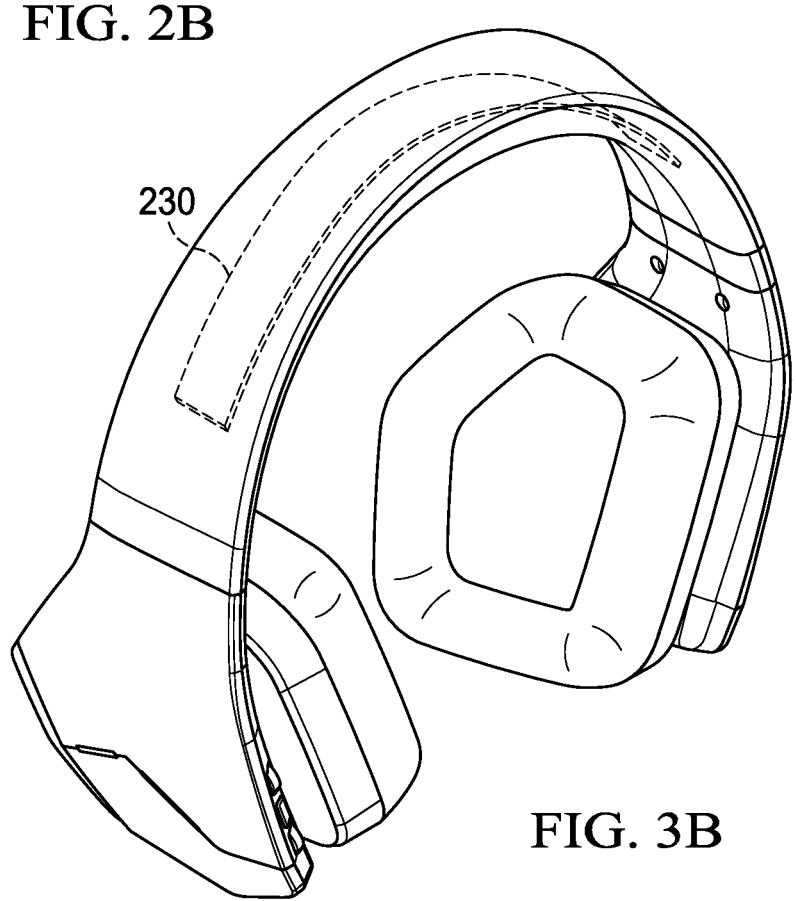
Figure 2C:
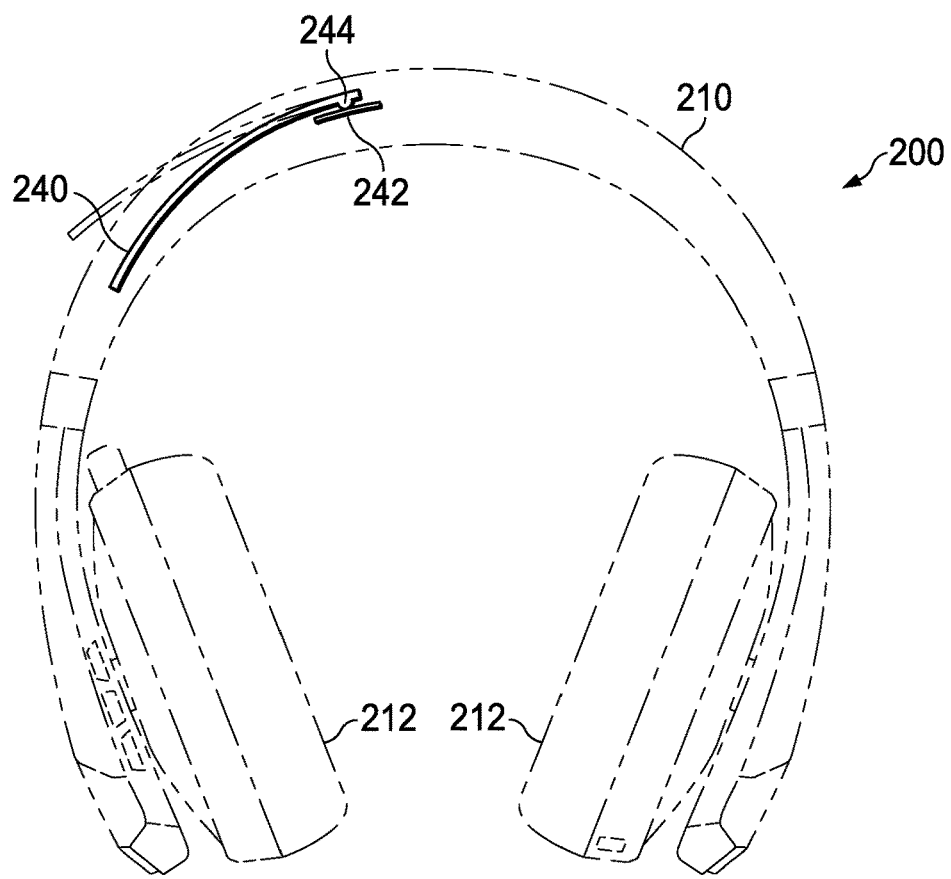
Figure 3C:
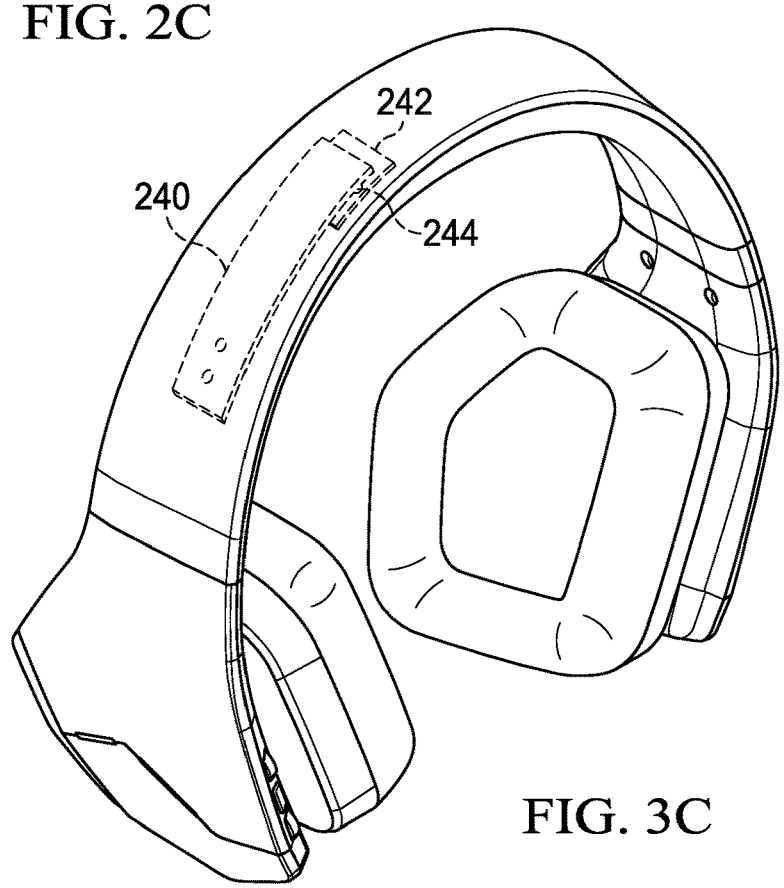

FIGS. 2A, 2B and 2C show front views of a headset 200 incorporating smart feature control. FIGS. 3A, 3B and 3C show perspective views of a headset incorporating smart feature control. The headset 200 includes a flexible headband 210 as well as one or more earpieces 212. The flexible headband is substantially arc shaped to fit over a user's head. The earpieces 212 include speakers for generating sound. A headband profile sensor 220 is mounted within the flexible headband 210.

FIGS. 2A and 3A show an embodiment of the headset in which the headband profile sensor 220 includes a short flex sensor (e.g., a flex sensor of substantially (+/−20%) 2 inches. The short flex sensor functions by providing resistance changes when the sensor undergoes a profile change. In certain embodiments, the sensor is mounted off-centered in the flexible headband (i.e., not mounted in a central location of the headband).

FIGS. 2B and 3B show an embodiment of the headset in which the headband profile sensor 220 includes a long flex sensor (e.g., a flex sensor of approximately (+/−20%) 5 inches. The long flex sensor functions by providing resistance changes when the sensor undergoes a profile change. In certain embodiments, the long flex sensor is substantially centrally located on the headband such that both ends of the flex sensor may be flexed when the headband is flexed.

FIGS. 2C and 3C show an embodiment of the headset in which the headband profile sensor includes a deflector 240 and force resistive sensor 242. The force resistive sensor 242 generates a resistance change when compressed by the deflector 240. In certain embodiments, the deflector 240 is substantially rigid where one end of the deflector 250 is mounted to the headband and the other end is movable and positioned over the sensor 242. When the headband is not worn (i.e., unflexed) the movable end of the deflector has a slight interference with the force resistive sensor (to ensure contact for assembly stack errors). When the headband is worn (i.e., flexed) the movable end of the deflector moves toward the force resistive sensor. Because the deflector is rigid, its profile does not change as much as the profile change of the headband and thus the deflector provides a force to the force resistive sensor. In certain embodiments, the deflector and the force resistive sensor are mounted off-centered in the flexible headband (i.e., not mounted in a central location of the headband).

The range of headband profile sensor 220 mounting positions are always somewhat bent, even when in an unflexed orientation. Thus, the headband profile sensor 220 is never used in a straight profile as the flexible headband 210 has no straight sections near the earpieces.

As used herein, headset un-used refers to an orientation where the headband is unflexed, which results in the headband profile sensor 220 being flexed and headset used refers to an orientation where the headband is fully flexed, which results in the headband profile sensor 220 being unflexed relative to when the headband profile sensor 220 is flexed.

Figure 4A:
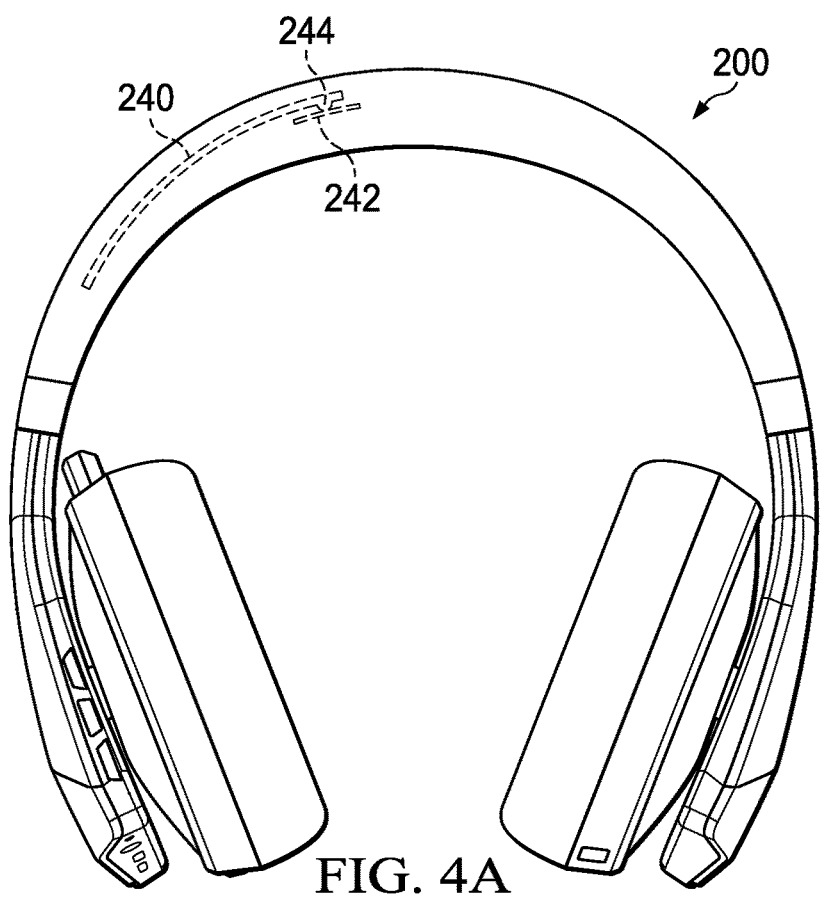
FIGS. 4A and 4B show front views of a headset in a flexed orientation and an unflexed orientation, respectively.
Figure 4B:
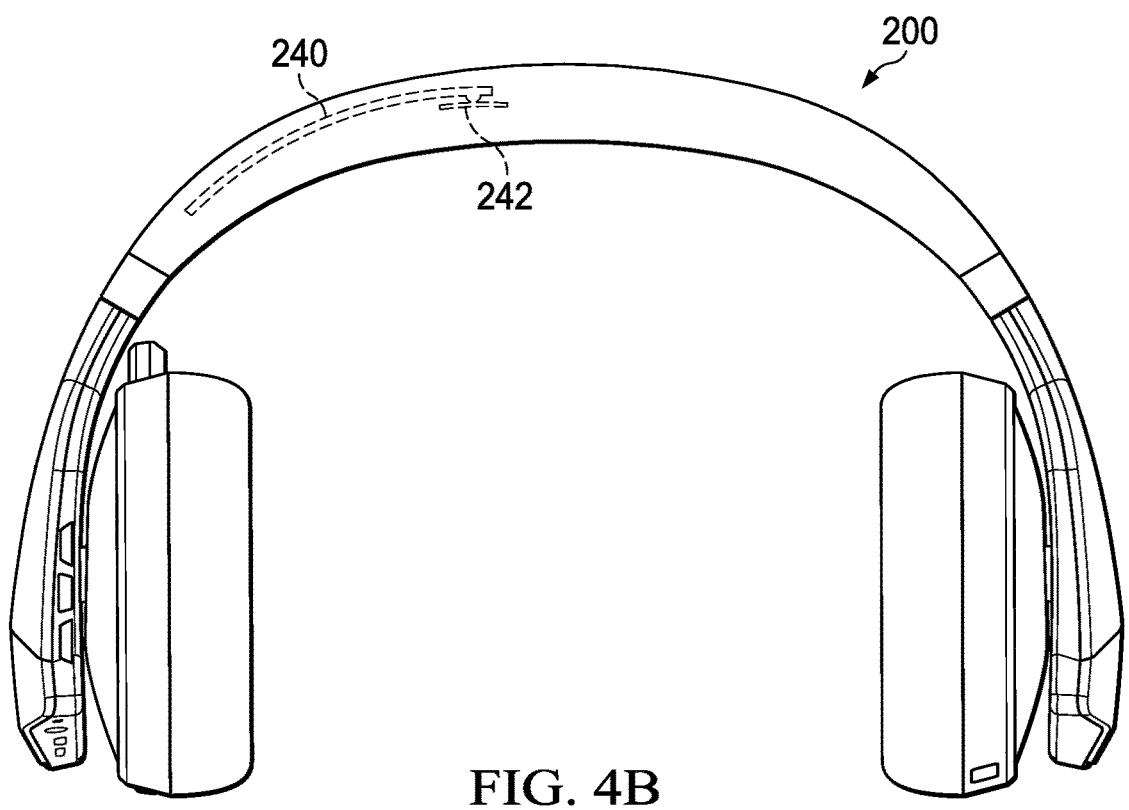

Mounting the headband profile sensor 220 off-center in the flexible headband 210 allows for more flexing dimensional change of the flex sensor as compared to a center-mounted location. The sides of the headband undergo more flexing as compared to the center location. Simulated flexing of headband profile sensor 220 indicates a change of ~10-15 mm flexing when it is placed at the sides nearer to one of the earpiece 212 (using scenarios of headset that is unused and when worn on a head of a user). A larger flexing range of the headband profile sensor 220 allows for more distinct resistance change of the Flex Sensor at the unflexed and fully flexed headband positions (corresponding to Power ON & Power OFF states). Additionally, mounting the headband profile sensor 220 off-center in the flexible headband 210 allows for better calibration with more tolerance allowance, especially at the Power ON state, as the headband profile can be slightly different when used on different sized user's head. Additionally, mounting the headband profile sensor 220 off-center in the flexible headband 210 allows for resistance differences of the headband profile sensor 220 when in a straight profile as sometime the flex sensor may have pre-bent errors in manufacturing, FIGS. 4A and 4B show front views of a headset 200 in an unflexed orientation and a flexed orientation, respectively. In operation, different flexing positions of the headband profile sensor 220 equate to different resistance value across the headband profile sensor 220. This resistance change is used to detect a voltage change across the headband profile sensor 220. Voltage range differences of the headband profile sensor 220 when the headband is in an flexed state (see e.g., FIG. 4B) and an unflexed state (see e.g., FIG. 4A) are used as indicators to toggle smart Power-OFF and smart-Power-ON states, respectively. Examples of what might cause the headset to be in an unflexed state include the headset being left on a table, ferried around in a carry back, hand-carries while walking between points and being hung on a hook. In certain embodiments, the flexed orientation may include an ultra flexed orientation such as when a user pries one earpiece away from the ear while the headset is worn. When this ultra flexed orientation is detected, the smart control system may cause an action, such as a smart feature, to be applied to the headset. In certain embodiments, the smart features may include features associated with this pried away earpiece state.

More specifically, the smart power-OFF state is toggled immediately to a deep sleep mode of operation when only the micro control unit (MCU) of the headset stays on to detect flex sensor resistance changes from its various bent positions and to check on the Bluetooth (BT) signal. The expected current drawn by the MCU to monitor flex sensor resistance changes and BT Signal is ~60 uA, as compared to certain known headset deep sleep modes utilizing <120 uA. With the smart power-OFF state, the headband is unflexed, the flex sensor is flexed and the flex sensor generates a high resistance, which causes a lower voltage drop across the sensor. In certain embodiments, the high resistance is substantially (i.e., +/−20%) 40K ohms and the voltage drop is substantially (i.e., +/−20%) 1.65 Volts DC. With the smart power-ON state, the headband is flexed, the flex sensor is unflexed and the flex sensor generates a lower resistance, which causes a larger voltage drop across the sensor. In certain embodiments, the lower resistance is substantially (i.e., +/−20%) 20K ohms and the voltage drop is substantially (i.e., +/−20%) 2.2 Volts DC.

The smart power control system provides an improved headset usage experience when there is on-going or incoming Audio IN activity by the incorporation of smart features control operation along with the smart power control system. For example, the smart features control operation allows a user to temporarily remove the headset and enable microphone mute (with on-going Audio IN) when talking to another person while a call is on-going, as well as to momentarily relieve headset fatigue during a long conference call. The smart features control operation allows Audio IN signals to be routed to the headset when user has placed it on his/her head, such as when preparing to answer a call that is being sent to their computer. The smart features control operation also allows a user to pause streaming media by removing the headset and to resume streaming media by donning the headset. The smart features control operation also allows a user to transfer call audio back and forth between a phone and the headset. For example, if a user is not wearing their headset and they receive a call on their mobile phone, the audio automatically routes to the phone whereas donning the headset automatically transfers the audio to the headset. If a user is already wearing their headset and then receives an incoming call, the audio will be automatically routed to the headset. If a user removes their headset, the audio is automatically transferred to the phone.

Figure 5A:
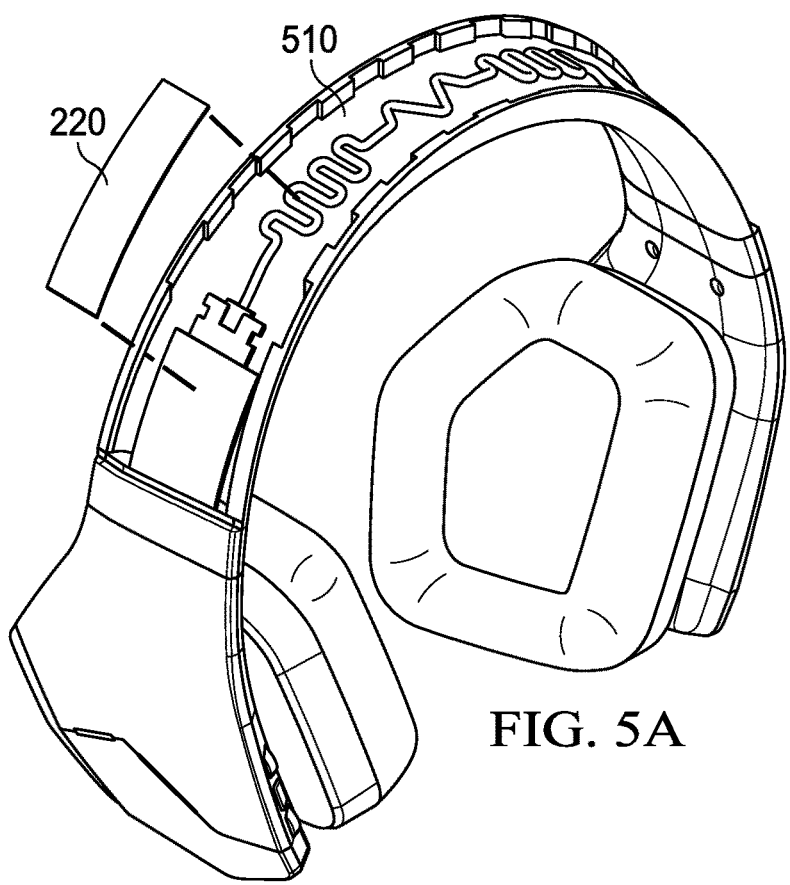
FIG. 5A shows a cut away perspective exploded view of a headset with a flex sensor.
Figure 5B:
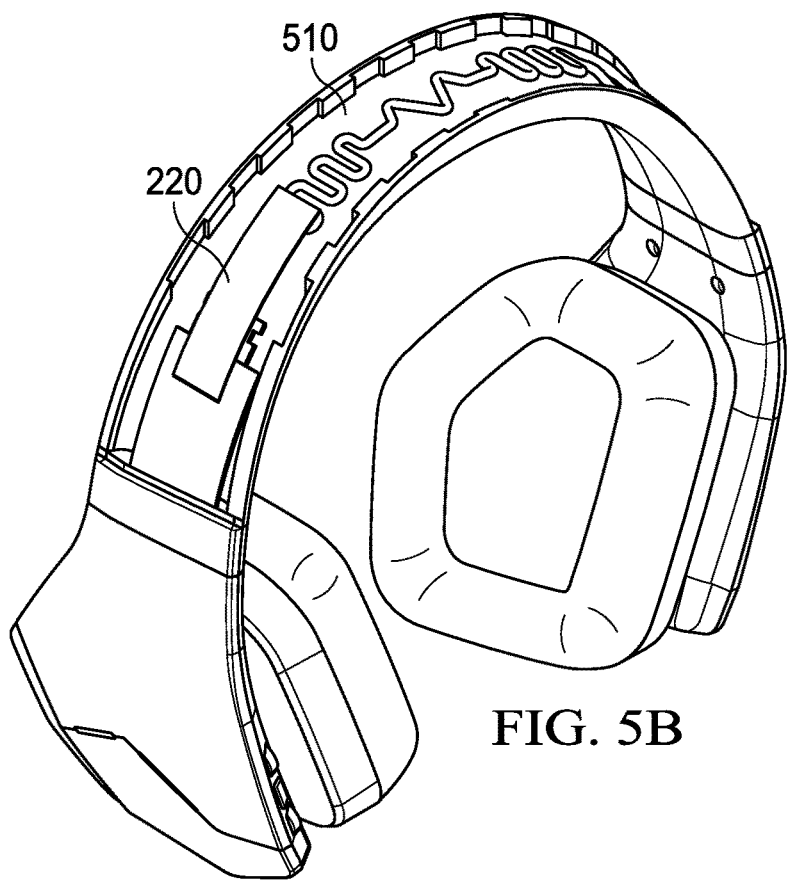
FIG. 5B shows a cut away perspective view of a headset with an installed flex sensor.
Figure 6A:
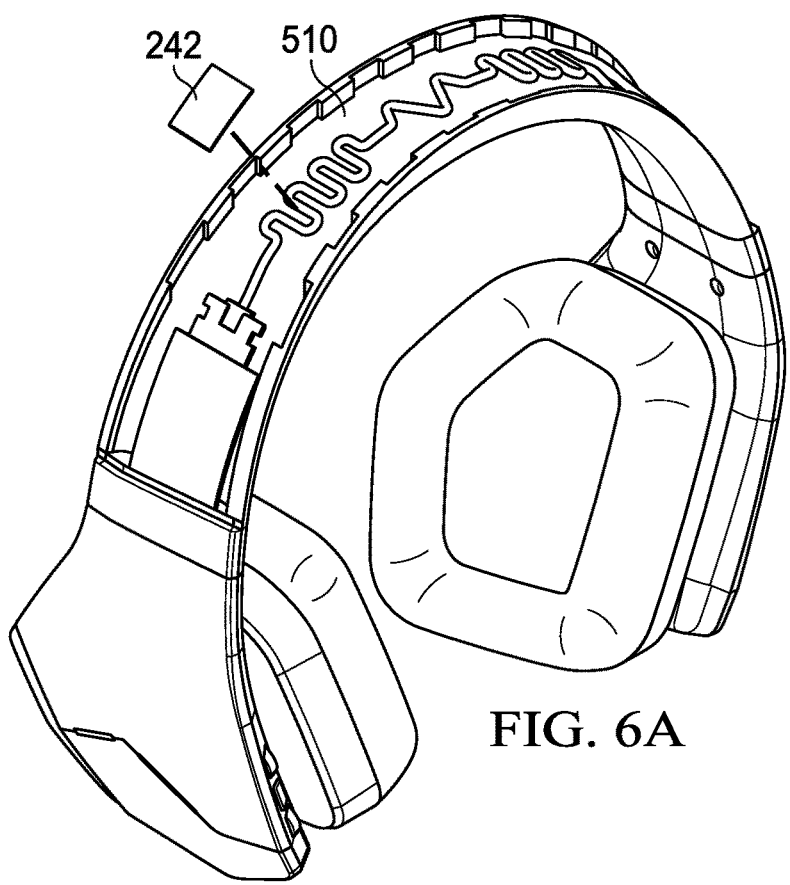
FIGS. 6A, 6B, 6C and 6D show cut away perspective views of a headset with a deflector and a force resistive sensor.
Figure 6B:
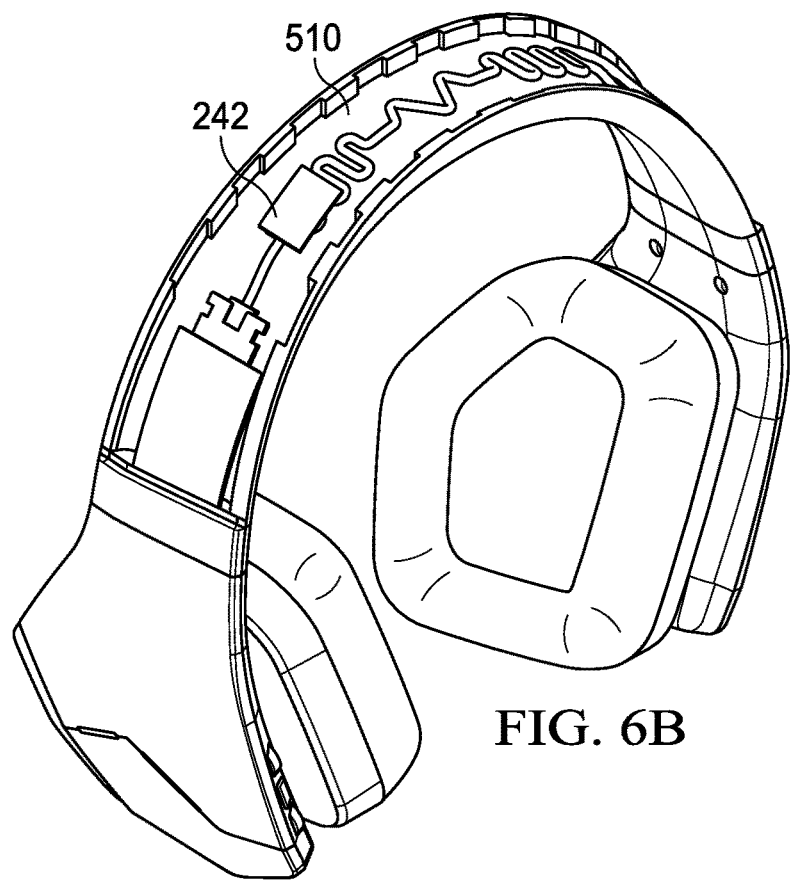
Figure 6C:
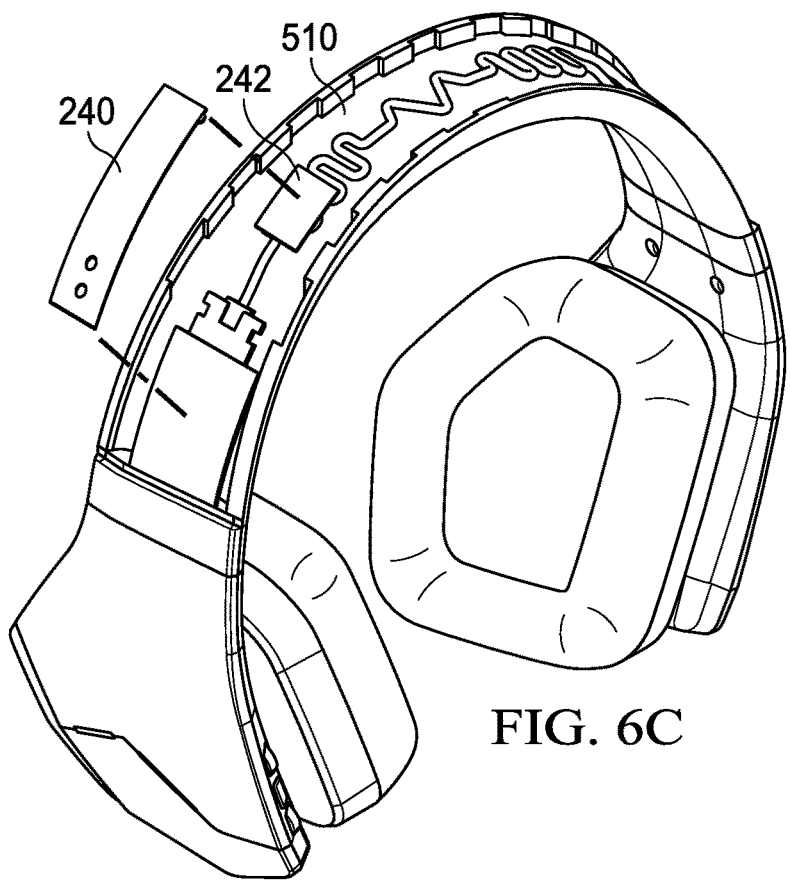
Figure 6D:
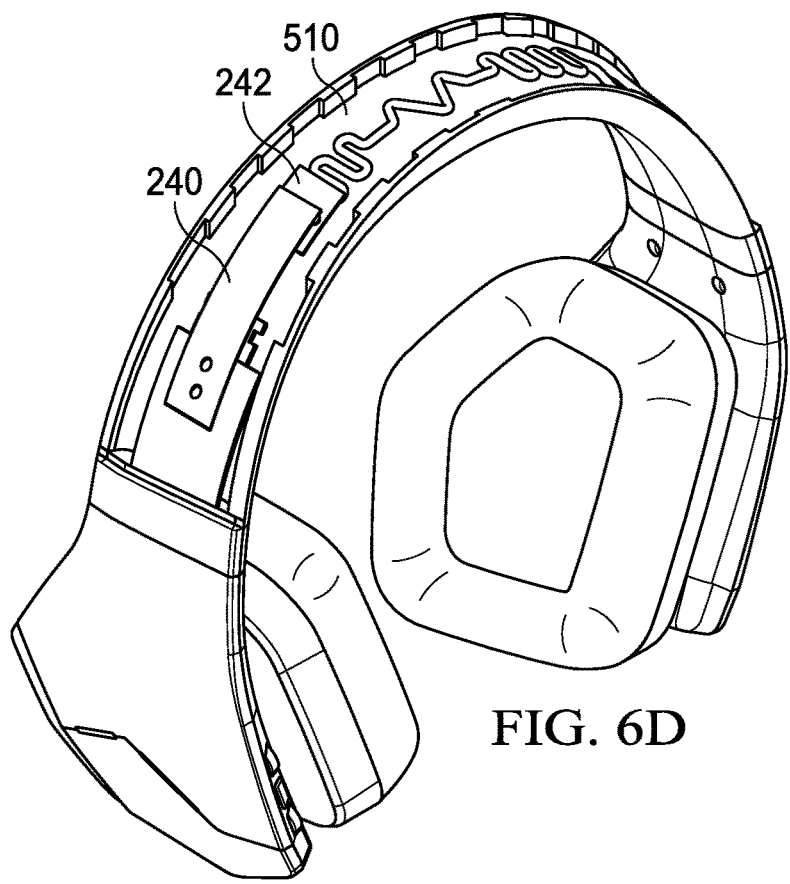

FIG. 5A shows a cut away perspective exploded view of a headset with a flex sensor. FIG. 5B shows a cut away perspective view of a headset with an installed flex sensor. The headband profile sensor 220 is mounted on the inner housing 510 of the headband. In certain embodiments, the headband profile sensor 220 is mounted via clips attached along the sensor film edges to prevent flex sensor from detaching from the headband.

FIGS. 6A, 6B, 6C and 6D show cut away perspective views of a headset with a deflector 240 and a force resistive sensor242. The force resistive sensor 242 is mounted on the inner housing of the headband. The deflector 240 is fastened at one end to the inner housing of the headband. In certain embodiments, the deflector 240 is fastened via screws which pass through apertures on one end of the deflector.

Figure 7A:
FIGS. 7A, 7B and 7C show a top view, a front flat view and front flexed view, respectively of a flex sensing component for use with a headset incorporating smart power control.
Figure 7B:
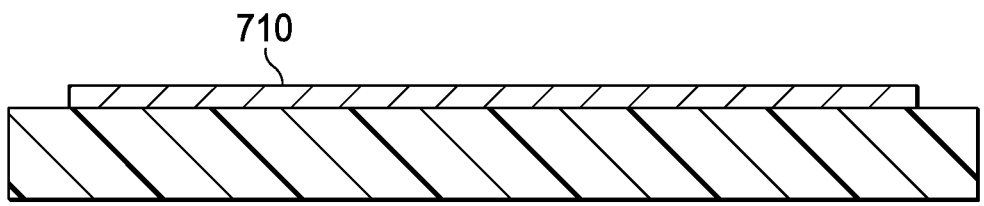
Figure 7C:
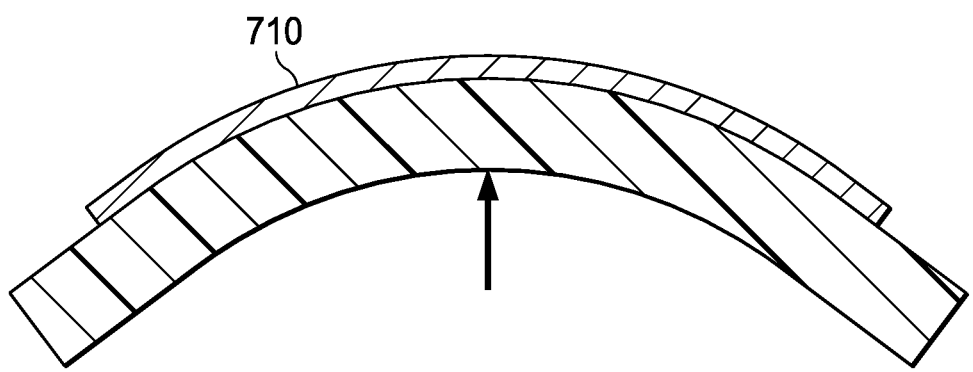

FIGS. 7A, 7B and 7C show a top view, a front flat view and front flexed view, respectively of a flex sensing component 700 for use with a headset incorporating smart power control. The flex sensing component 700, also referred to as a flex sensor, includes a sensor film 710, and a substrate 712. A first electrically conductive contact 720 is coupled to one edge 722 of the sensor film 710. A second electrically conductive contact 730 is coupled to another edge 732 of the sensor film 710. In certain embodiments, the electrically conductive contact 720 and the electrically conductive contact 730 are mounted to the substrate 712.

Figure 8A:
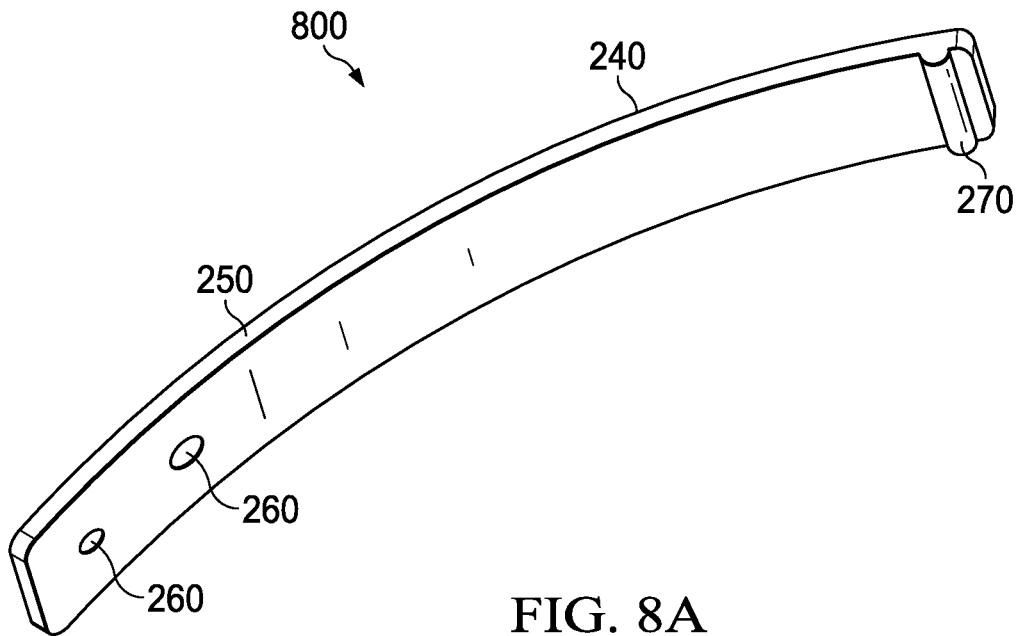
FIGS. 8A and 8B show perspective views of a deflector and a deflector and force resistive sensor, respectively.
Figure 8B:
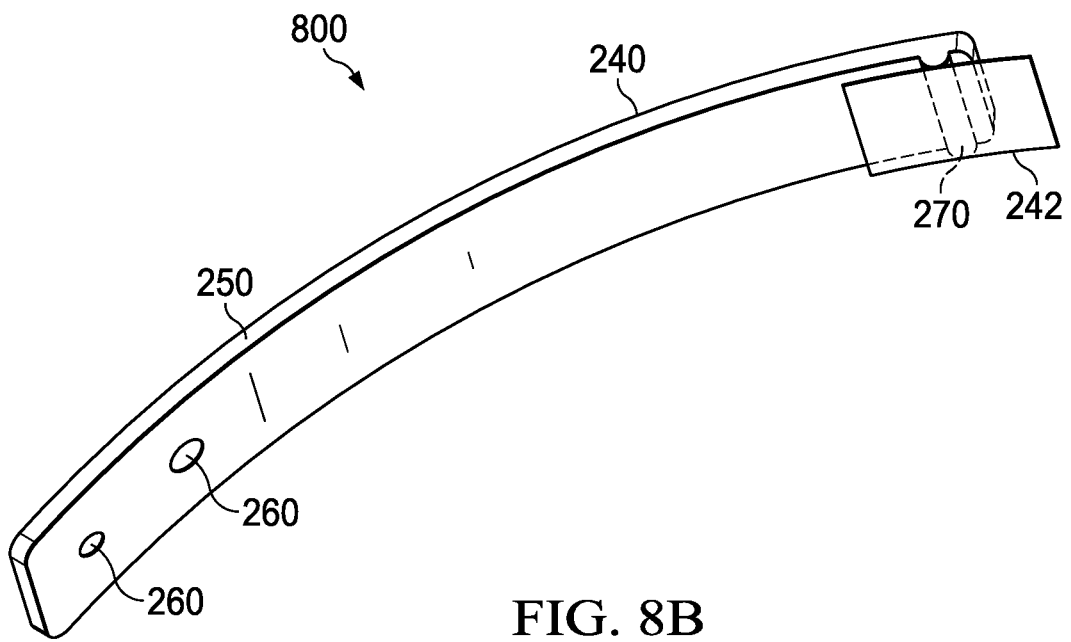

FIGS. 8A and 8B show perspective views of a force sensing component 800. In certain embodiments, the force sensing component includes a deflector 240 and force resistive sensor 242, respectively. The force resistive sensor 242 generates a resistance change when compressed by the deflector 240. In certain embodiments, the deflector 240 is substantially rigid where one end of the deflector 250 is mounted to the headband and the other end is movable and positioned over the sensor 242. In certain embodiments, the deflector 240 is mounted to the headband via fasteners using the apertures 260. In certain embodiments, the movable end of the deflector includes a protrusion 270. In certain embodiments, by providing the protrusion, more force is applied to the force sensitive sensor when the headband is flexed.

Figure 9:
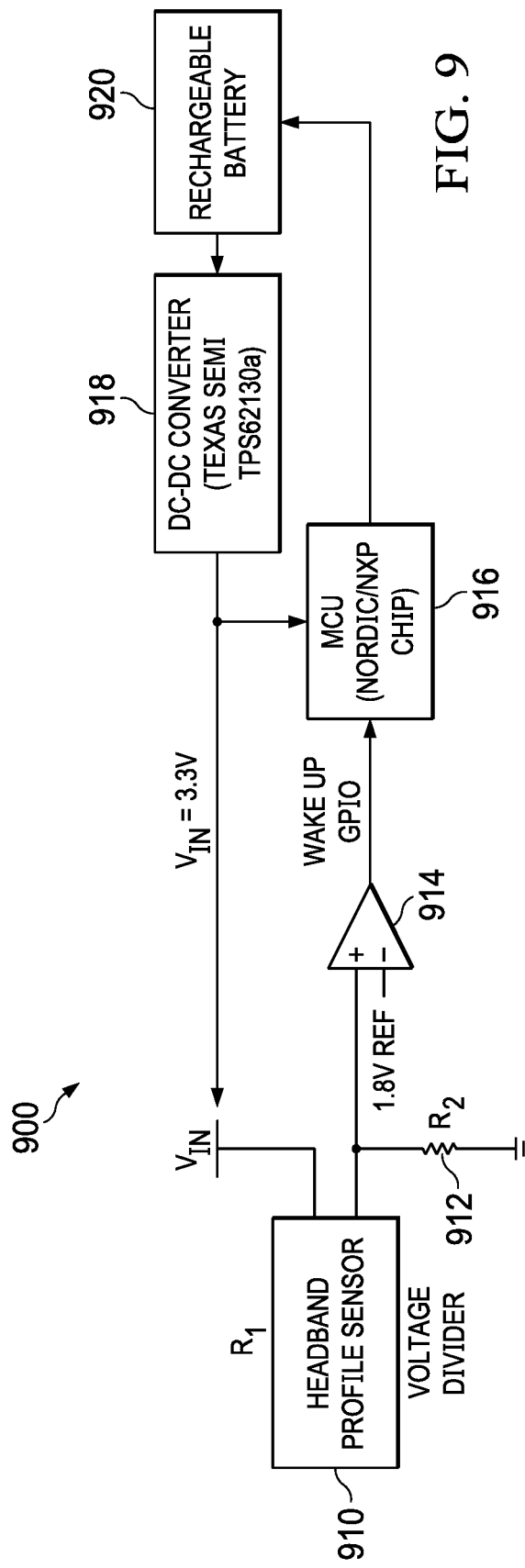
FIG. 9 shows a schematic view of a smart features control system for use with a wireless headset.

FIG. 9 shows a schematic view of a smart power control system 900 for use with a headset. The smart power control system 900 includes one or more of a headband profile sensor 910, a resistor 912, a voltage comparator 914, a micro control unit (MCU) 916, a DC-DC converter 918 and a battery 920. In certain embodiments, the headband profile sensor 910 corresponds to one of the flex sensing component 700 and the force sensing component 800. In certain embodiments, the headband profile sensor generates a resistance back between 10K ohms and 40K ohms. In certain embodiments, the headband profile sensor resistance is maintained between 20K ohms and 40K ohms as the sensor is always semi flexed when installed on the headset. In certain embodiments, the resistor 912 has a resistance of 40K ohms. In certain embodiments, the MCU 916 is available from NXP semiconductor. In certain embodiments, the DC-DC converter 918 is available from Texas Instruments under the trade designation TPS62130a. In certain embodiments, the battery 920 is a rechargeable battery.

In certain embodiments, one contact of the flex sensor 910 is coupled to one end of the resistor 912 as well as an input of the voltage comparator 914. The other end of the resistor 912 is coupled to ground, thus providing a voltage divider. The other input of the voltage comparator 914 is coupled to a sensor threshold reference voltage (e.g., 1.8v). In certain embodiments, the sensor threshold reference voltage is set to be between a sensor flexed state and a sensor unflexed state. Based upon the results of the voltage comparison, the voltage comparator 914 generates a wake up signal which is provided to the MCU 916. In certain embodiments, the wake up signal is a general purpose I/O (GPIO) signal. In response to receipt of the wake up signal, the MCU 916 wakes up the battery 920.

Figure 10A:
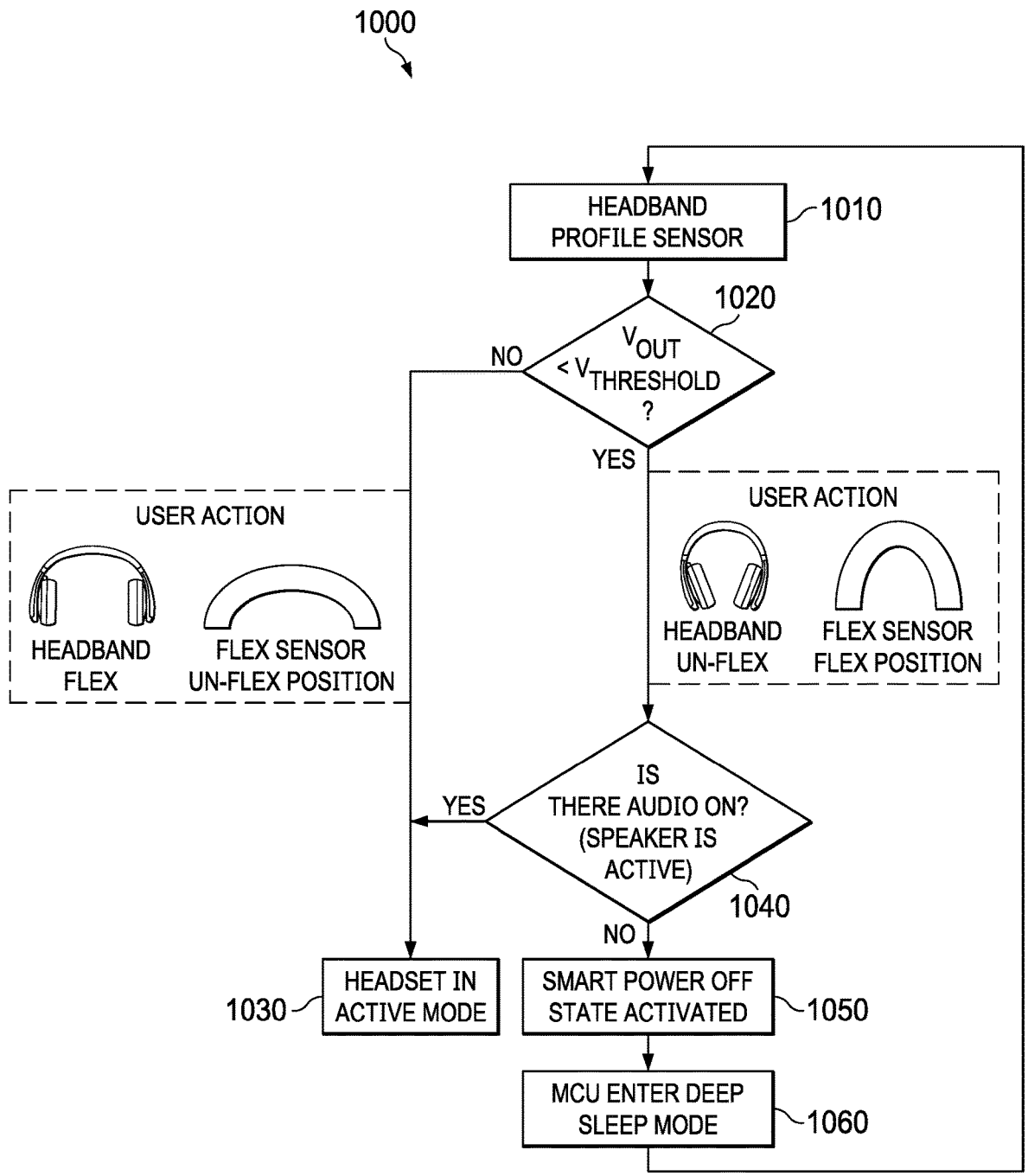
FIGS. 10A and 10B show flow charts of the operation of a smart features control system for use with a headset.

FIG. 10A shows a flow chart of the operation 1000 of a smart feature control system for use with a headset. A flex sensor circuit monitors voltage across the flex sensor at step 1010. Next, the operation determines whether the voltage produced by the flex sensor circuit ($V_{out}$) is less than a threshold voltage $V_{Threshold}$) at step 1020. The flex sensor circuit voltage is less than the threshold voltage then the flex sensor is in a flexed position. The flex sensor circuit voltage is greater than or equal to the threshold voltage then the flex sensor is in an unflexed position. When the flex sensor circuit voltage is greater than or equal to the threshold voltage then the headset is set to an active mode of operation at step 1030. When the flex sensor circuit voltage is less than the threshold voltage then the operation proceeds to determining whether the headset is receiving an audio signal at step 1040. If so, then the headset is set to an active mode of operation at step 1030. It will be appreciated that while the operation 1000 shown in FIG. 10A illustrates a flex sensor component 700, the operation can also be performed using an embodiment of the headset which includes a force sensing component 800.

Figure 10B:
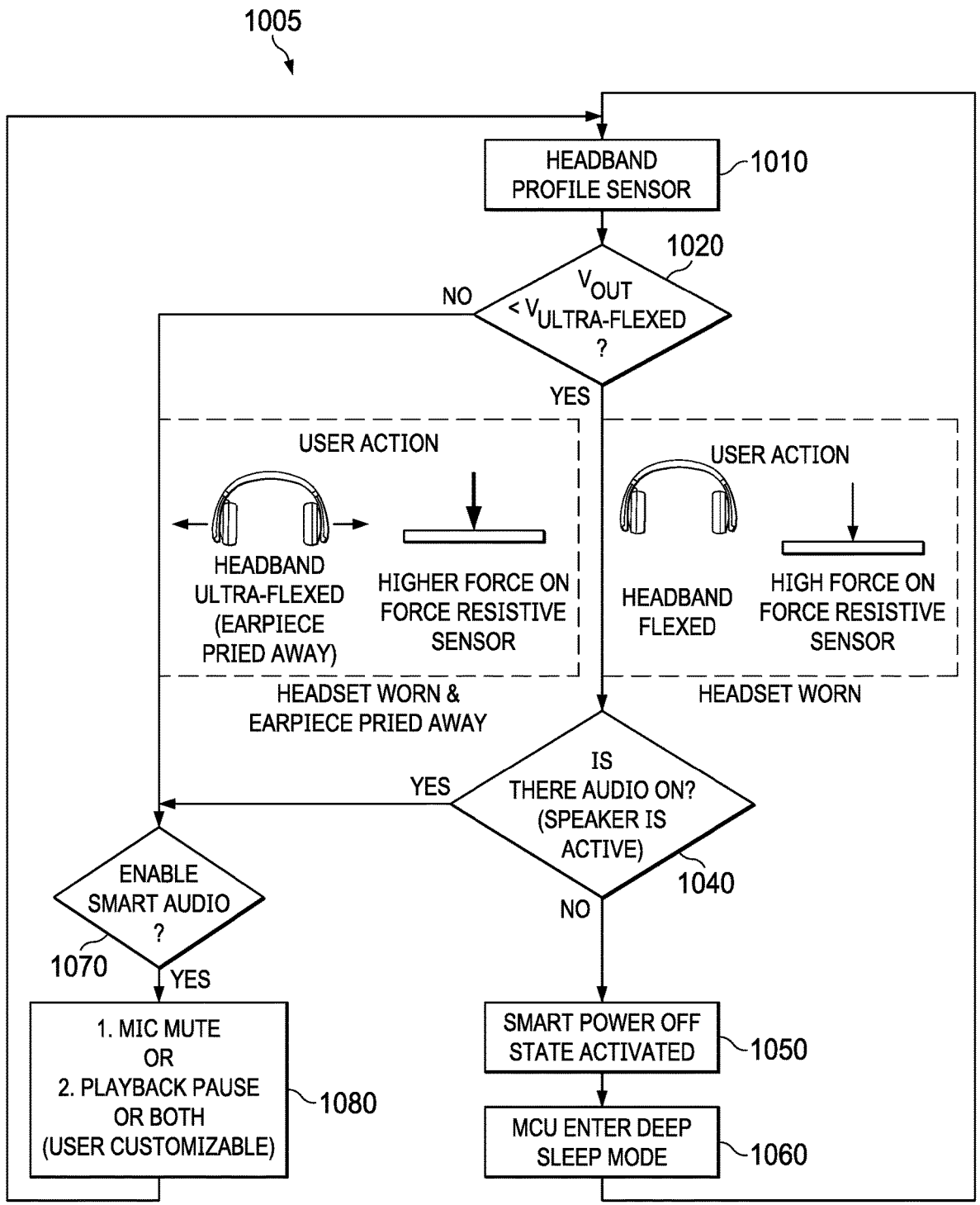

FIG. 10B shows a flow chart of the operation 1005. A force sensing component monitors voltage generated by a force resistive sensor at step 1020. The operation 1005 includes a determination of whether smart audio is enabled at step 1070. Smart audio is an example of a smart feature that is controlled via the smart feature control system. When smart audio is enabled, then a smart feature operation is performed when the force sensing component determines that the headset is in an ultra flexed state. In certain embodiments, the smart feature operation is user customizable. In certain embodiments, the smart feature operation includes one or both of a microphone mute operation and a playback pause operation.

If the headset is not receiving an audio signal then a smart power off state is activated on the headset at step 1050. Next, the MCU is set to enter a deep sleep mode of operation at step 1060. During the deep sleep mode of operation, only the micro control unit (MCU) of the headset stays on to detect flex sensor resistance changes from its various bent positions and to check on the Bluetooth (BT) signal.

FIGS. 11A and 11B show example values for various states of a headset incorporating smart power control. More specifically, FIG. 11A shows values for the various states of the headset for embodiments incorporating a flex sensor such at flex sensing component 700. FIG. 11B shows values for the various states of the headset for embodiments incorporating a force sensing component such as force sensing component 800.

FIGS. 12A, 12B and 12C show example battery life saving estimates for a wireless headset which incorporates a smart power control system. These examples show battery life savings examiners for different usage patterns when compared to a known time-out type of operation. The baseline comparison is performed using an example headset with a rechargeable battery of 750 mAH.

For example, when a usage pattern for the headset which incorporates the smart power control system is 2 hrs active per day (22 hrs Sleep) the battery life saving is estimated to be 19% when compared to a known time-out type of operation. When a usage pattern for the headset which incorporates the smart power control system is 4 hours active per day (20 hours Sleep) the battery life saving is estimated to be 9% when compared to a known time-out type of operation. When a usage pattern for the headset which incorporates the smart power control system is 8 hours Active per day (16 hrs Sleep) the battery life saving is estimated to be 9% when compared to a known time-out type of operation. Thus, battery life savings are more when the Standby Modes (Sleep/Deep Sleep Modes) are used for longer durations.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A headset, comprising:
 an earpiece;
 a flexible headband coupled to the earpiece, the flexible headband including a headband profile sensing component, the headband profile sensing component determining when the headset is in a headset un-used orientation and a headset used orientation; and,
 a smart features control system, the smart features control system performing a smart features operation based upon whether the headset is in the headset un-used orientation or the headset used orientation; and wherein
 the headband profile sensing component generates a variable resistance based upon an amount of detected flex.

2. The headset of claim 1, wherein:
 the headband profile sensing component is positioned off center within the flexible headband.

3. The headset of claim 1, wherein:
 the headband profile sensing component detects when the flexible headband is in an ultra flexed orientation; and,
 the smart features control system performs a smart feature control operation when the flexible headband is in the ultra flexed orientation.

4. The headset of claim 1, wherein:
 the smart features control system includes a voltage comparator, the voltage comparator comparing a voltage generated across the headband profile sensing component with a threshold voltage; and,
 the headband profile sensing component is coupled to a resistor to provide a voltage divider.

5. The headset of claim 1, wherein:
 the smart features control system places a micro control unit in a deep sleep when the headset is in the headset un-used orientation.

6. A system comprising:
 a processor;
 a data bus coupled to the processor; and
 an input/output device, the input/output device including a wireless headset, the headset comprising
  an earpiece;
  a flexible headband coupled to the earpiece, the flexible headband including a headband profile sensing component, the headband profile sensing component determining when the headset is in a headset un-used orientation and a headset used orientation; and,
  a smart feature control system, the smart feature control system performing a feature power control operation based upon whether the headset is in the headset un-used orientation or the headset used orientation; and wherein
  the headband sensing component generates a variable resistance based upon an amount of detected flex.

7. The system of claim 6, wherein:
 the headband profile sensing component is positioned off center within the flexible headband.

8. The system of claim 6, wherein:
 the headband profile sensing component detects when the flexible headband is in an ultra flexed orientation; and,
 the smart features control system performs a smart feature control operation when the flexible headband is in the ultra flexed orientation.

9. The system of claim 6, wherein:
 the smart features control system includes a voltage comparator, the voltage comparator comparing a voltage generated across the headband profile sensing component with a threshold voltage; and,
 the headband profile sensing component is coupled to a resistor to provide a voltage divider.

10. The system of claim 6, wherein:
 the smart features control system places a micro control unit in a deep sleep when the headset is in the headset un-used orientation.

* * * * *